United States Patent
Henley et al.

(10) Patent No.: US 6,448,152 B1
(45) Date of Patent: Sep. 10, 2002

(54) METHOD AND SYSTEM FOR GENERATING A PLURALITY OF DONOR WAFERS AND HANDLE WAFERS PRIOR TO AN ORDER BEING PLACED BY A CUSTOMER

(75) Inventors: Francois J. Henley, Aptos; Sien G. Kang, Pleasanton; Igor J. Malik, Palo Alto, all of CA (US)

(73) Assignee: Silicon Genesis Corporation, Campbell, CA (US)

( * ) Notice: Subject to any disclaimer, the term of this patent is extended or adjusted under 35 U.S.C. 154(b) by 0 days.

(21) Appl. No.: 09/906,865

(22) Filed: Jul. 16, 2001

Related U.S. Application Data

(63) Continuation-in-part of application No. 09/790,026, filed on Feb. 20, 2001.

(51) Int. Cl.[7] .......................... H01L 21/30; H01L 21/46
(52) U.S. Cl. .................... 438/458; 438/459; 700/121
(58) Field of Search .................. 438/455, 458, 438/459, 465, 510, 515, 526, 690, 800; 700/121

(56) References Cited

U.S. PATENT DOCUMENTS 5,374,564 A * 12/1994 Bruel .......................... 438/455
5,714,395 A * 2/1998 Bruel .......................... 438/528
6,300,218 B1 * 10/2001 Cohen et al. ................ 438/423
6,321,134 B1 * 11/2001 Henley et al. .............. 700/121

* cited by examiner

Primary Examiner—Michael Sherry
Assistant Examiner—Asok Kumar Sarkar
(74) Attorney, Agent, or Firm—Wagner Murabito & Hao LLP

(57) ABSTRACT

A method for generating a plurality of donor wafers and handle wafers prior to an order being placed by a customer. For example, a plurality of donor wafers with different silicon layer thicknesses along with a plurality of handle wafers with different oxide layer thicknesses are fabricated. Subsequently, a customer may place an order for silicon-on-insulator (SOI) wafers which share defined parameters. Therefore, a prefabricated donor wafer and handle wafer are selected based on the customer's defined parameters and then bonded together. Next, the donor wafer is cleaved from the handle wafer wherein the handle wafer retains the silicon layer of the donor wafer. The silicon layer thickness of the handle wafer may be altered to meet the customer's parameters. For example, an epitaxial smoothing process may decrease the silicon layer thickness while an epitaxial thickening process may increase the silicon layer thickness.

29 Claims, 6 Drawing Sheets

METHOD AND SYSTEM FOR GENERATING A PLURALITY OF DONOR WAFERS AND HANDLE WAFERS PRIOR TO AN ORDER BEING PLACED BY A CUSTOMER

CROSS REFERENCE TO RELATED APPLICATIONS

This is a continuation-in-part of and claims priority to U.S. patent application Ser. No.: 09/790,026 entitled "Method and Device for Controlled Cleaving Process" by Francois J. Henley et al., filed Feb. 20, 2001.

TECHNICAL FIELD

The present invention relates to the field of manufacturing objects. More specifically, the present invention relates to the field of manufacturing semiconductor wafers.

BACKGROUND ART

Integrated circuits are fabricated on chips of semiconductor material. These integrated circuits often contain thousands, or even millions, of transistors and other devices. In particular, it is desirable to put as many transistors as possible within a given area of semiconductor because more transistors typically provide greater functionality, and a smaller chip means more chips per wafer and lower costs. Some integrated circuits are fabricated on a slice or wafer, of single-crystal (monocrystalline) silicon, commonly termed a "bulk" silicon wafer. Devices on such "bulk" silicon wafer typically are isolated from each other. A variety of techniques have been proposed or used to isolate these devices from each other on the bulk silicon wafer, such as a local oxidation of silicon (LOCOS) process, trench isolation, and others. These techniques, however, are not free from limitations. For example, conventional isolation techniques consume a considerable amount of valuable wafer surface area on the chip, and often generate a non-planar surface as an artifact of the isolation process. Either or both of these considerations generally limit the degree of integration achievable in a given chip. Additionally, trench isolation often requires a process of reactive ion etching, which is extremely time consuming and can be difficult to achieve accurately.

An approach to achieving very-large scale integration (VLSI) or ultra-large scale integration (ULSI) is by using a silicon-on-insulator (SOI) wafer. An SOI wafer typically has a layer of silicon on top of a layer of an insulator material. A variety of techniques have been proposed or used for fabricating SOI wafers. These techniques include, among others, growing a thin layer of silicon on a sapphire substrate, bonding a layer of silicon to an insulating substrate, and forming an insulating layer beneath a silicon layer in a bulk silicon wafer. In an SOI integrated circuit, essentially complete device isolation is often achieved using conventional device processing methods by surrounding each device, including the bottom of the device, with an insulator. An advantage SOI wafers have over bulk silicon wafers is that the area required for isolation between devices on an SOI wafer is less than the area typically required for isolation on a bulk silicon wafer.

SOI offers other advantages over bulk silicon technologies as well. For example, SOI offers a simpler fabrication sequence compared to a bulk silicon wafer. Devices fabricated on SOI wafers may also have better radiation resistance, less photo-induced current, and less cross-talk than devices fabricated on bulk silicon wafers. However, it should be appreciated that there are disadvantages associated with fabricating SOI wafers.

One of the disadvantages is that fabricating a batch of substantially uniform SOI wafers such that they satisfy a predefined set of parameters typically is a time consuming process. Therefore, if a customer (for example) orders a batch of SOI wafers that are to satisfy certain parameters, the turnaround time to fulfill the order generally has a negative affect on how quickly the particular product associated with the ordered SOI wafers is able to reach its market.

SUMMARY OF THE INVENTION

Accordingly, a need exists for a method and system which enables silicon-on-insulator (SOI) wafers to be fabricated more efficiently thereby reducing the turnaround time of fulfilling an order for a batch of predefined SOI wafers. The present invention provides a method and system which accomplishes the above mentioned need.

One embodiment of the present invention provides a method for generating a plurality of donor wafers and handle wafers prior to an order being placed by a customer. For example, a plurality of donor wafers with different silicon layer thicknesses along with a plurality of handle wafers with different oxide layer thicknesses are fabricated. Subsequently, a customer may place an order for silicon-on-insulator (SOI) wafers which share defined parameters. Therefore, a prefabricated donor wafer and handle wafer are selected based on the customer's defined parameters and then bonded together. Next, the donor wafer is cleaved from the handle wafer wherein the handle wafer retains the silicon layer of the donor wafer. The silicon layer thickness of the handle wafer may be altered to meet the customer's parameters. For example, an epitaxial smoothing process may decrease the silicon layer thickness while an epitaxial thickening process may increase the silicon layer thickness.

In another embodiment, the present invention includes a method for generating a plurality of donor wafers and handle wafers prior to an order being placed by a customer. The method includes the step of receiving a desired layer thickness. Furthermore, the method includes the step of selecting a donor wafer based upon the desired layer thickness from a plurality of donor wafers having different thicknesses of a first material layer. Additionally, the method includes the step of selecting a handle wafer based upon the desired layer thickness from a plurality of handle wafers having different thicknesses of a second material layer. The method also includes the step of bonding the donor wafer and the handle wafer together. Moreover, the method includes the step of modifying the thickness of the first material layer to attain the desired layer thickness.

In yet another embodiment, the present invention includes a computer readable medium having computer readable code embodied therein for causing a system to perform particular steps. Specifically, the computer readable medium causes the system to perform the steps described within the previous paragraph.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Figure 1:
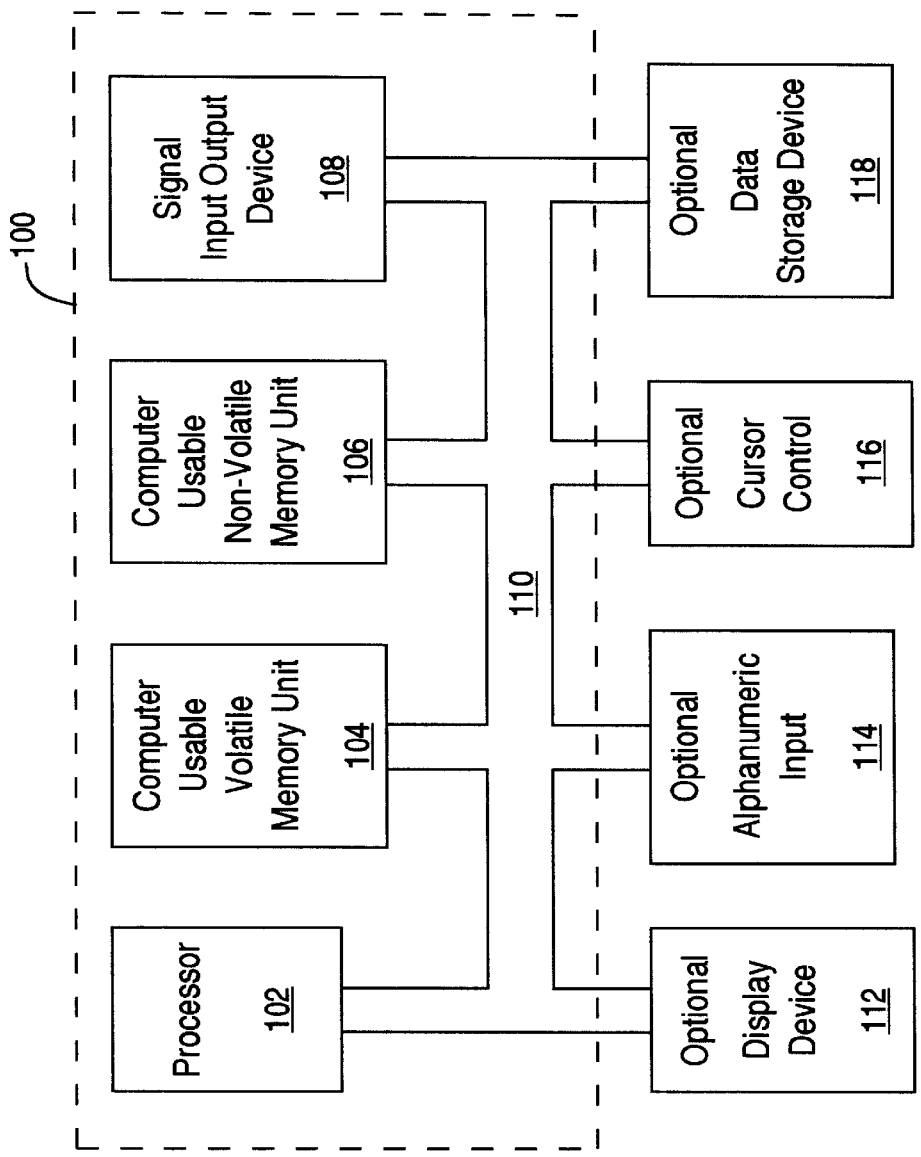
FIG. 1 is a block diagram of an exemplary computer system used in accordance with one embodiment of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions which follow are presented in terms of procedures, logic blocks, processing, and other symbolic representations of operations on data bits within a computer or digital system memory. These descriptions and representations are the means used by those skilled in the data processing arts to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Usually, though not necessarily, these physical manipulations take the form of electrical or magnetic signals capable of being stored, transferred, combined, compared, and otherwise manipulated in a computer system or similar electronic computing device. For reasons of convenience, and with reference to common usage, these signals are referred to as bits, values, elements, symbols, characters, terms, numbers, or the like with reference to the present invention.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussions, it is understood that throughout discussions of the present invention, discussions utilizing terms such as "generating" or "determining" or "selecting" or "modifying" or "outputting" or "transmitting" or "locating" or "storing" or "receiving" or "recognizing" or "utilizing" or "providing" or the like, may refer to the action and processes of a computer system, or similar electronic computing device, that manipulates and transforms data. The data is represented as physical (electronic) quantities within the computer system's registers and memories and is transformed into other data similarly represented as physical quantities within the computer system memories or registers or other such information storage, transmission, or display devices.

EXEMPLARY HARDWARE IN ACCORDANCE WITH THE PRESENT INVENTION

FIG. 1 is a block diagram of one embodiment of an exemplary computer system 100 used in accordance with the present invention. It should be appreciated that system 100 is not strictly limited to be a computer system. As such, system 100 of the present embodiment is well suited to be any type of computing device (e.g., controller, server computer, portable computing device, etc.). Within the following discussions of the present invention, certain processes and steps are discussed that are realized, in one embodiment, as a series of instructions (e.g., software program) that reside within computer readable memory units of computer system 100 and executed by a processor(s) of system 100. When executed, the instructions cause computer 100 to perform specific actions and exhibit specific behavior which is described in detail below.

Computer system 100 of FIG. 1 comprises an address/data bus 110 for communicating information, one or more central processors 102 coupled with bus 110 for processing information and instructions. Central processor unit(s) 102 may be a microprocessor or any other type of processor. The computer 100 also includes data storage features such as a computer usable volatile memory unit 104 (e.g., random access memory, static RAM, dynamic RAM, etc.) coupled with bus 110 for storing information and instructions for central processor(s) 102, a computer usable non-volatile memory unit 106 (e.g., read only memory, programmable ROM, flash memory, EPROM, EEPROM, etc.) coupled with bus 110 for storing static information and instructions for processor(s) 102. System 100 also includes one or more signal generating and receiving devices 108 coupled with bus 110 for enabling system 100 to interface with other electronic devices. The communication interface(s) 108 of the present embodiment may include wired and/or wireless communication technology. For example, in one embodiment of the present invention, the communication interface 108 is a serial communication (COM) port, but could also alternatively be any of a number of well known communication standards and protocols, e.g., Universal Serial Bus (USB), Ethernet, FireWire (IEEE 1394), parallel, small computer system interface (SCSI), infrared (IR) communication, Bluetooth wireless communication, broadband, and the like.

Optionally, computer system 100 can include an alphanumeric input device 114 including alphanumeric and function keys coupled to the bus 110 for communicating information and command selections to the central processor(s) 102. The computer 100 can include an optional cursor control or cursor directing device 116 coupled to the bus 110 for communicating user input information and command selections to the central processor(s) 102. The cursor directing device 116 can be implemented using a number of well known devices such as a mouse, a track-ball, a track-pad, an optical tracking device, a touch screen, etc. Alternatively, it is appreciated that a cursor can be directed and/or activated via input from alphanumeric input device 114 using special keys and key sequence commands. The present embodiment is also well suited to directing a cursor by other means such as, for example, voice commands. The system 100 can also include a computer usable mass data storage device 118 such as a magnetic or optical disk and disk drive (e.g., hard drive or floppy diskette) coupled with bus 110 for storing information and instructions. An optional display device 112 is coupled to bus 110 of system 100 for displaying video and/or graphics. It should be appreciated that optional display device 112 may be a cathode ray tube (CRT), flat panel liquid crystal display (LCD), field emission display (FED), or any other display device suitable for displaying video and/or graphic images and alphanumeric characters recognizable to a user.

EXEMPLARY OPERATIONS IN ACCORDANCE WITH THE PRESENT INVENTION

Figure 2:
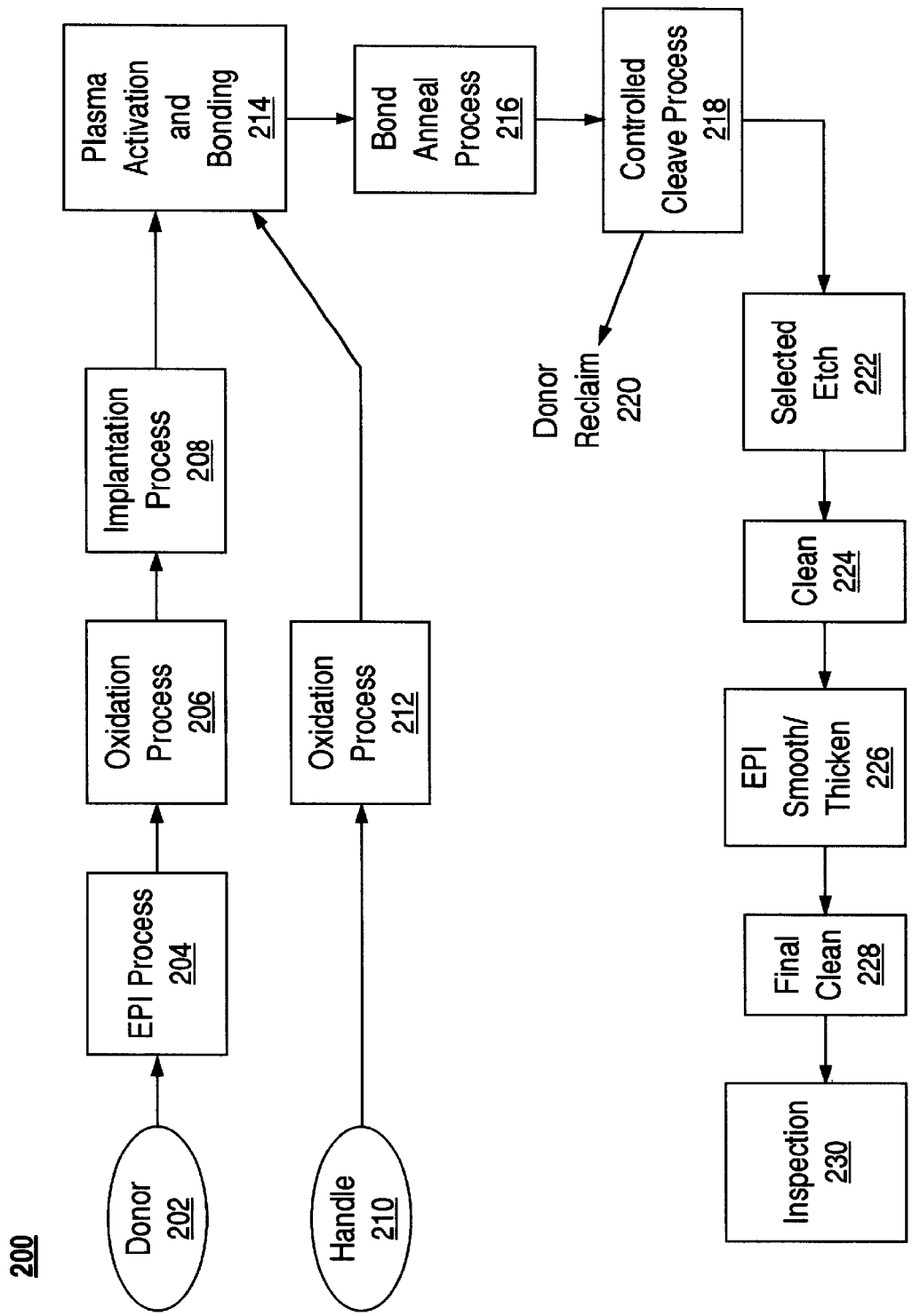
FIG. 2 is a block diagram illustrating an exemplary process for fabricating silicon-on-insulator (SOI) wafers in accordance with an embodiment of the present invention.

FIG. 2 is a block diagram illustrating an exemplary process 200 (e.g., NanoCleave™ Process) for fabricating silicon-on-insulator (SOI) wafers in accordance with an embodiment of the present invention. Specifically, process 200 includes fabricating a donor wafer 202 along with a handle wafer 210 which are then bonded together. Subsequently, a controlled cleaving process is utilized in order to separate the donor wafer 202 and the handle wafer 210. In this manner, the handle wafer 202 retains (for example) the silicon layer of the donor wafer 202. Depending on the desired parameters of the end-product silicon-on-insulator wafer, the silicon layer of the handle wafer 210 may be modified in order to alter its thickness. For example, an epitaxial smoothing process may be utilized in order to decrease the thickness of the silicon layer of the handle wafer 210 while an epitaxial thickening process may be utilized in order to increase its silicon layer thickness.

More specifically, before beginning process 200, the donor wafer 202 first has a cleave plane layer formed on a surface of its substrate. It should be appreciated that the cleave plane of the present embodiment is well suited to be comprised of different materials. For example, the cleave plane may be comprised of silicon germanium which is pseudomorphically grown on the substrate surface of the donor wafer 202. The purpose of the cleave plane will become evident during the description of a controlled cleave process 218. Subsequently, donor wafer 202 enters an epitaxial (EPI) process 204 where a layer of material (e.g., silicon) is deposited over the cleave plane of the donor wafer 202. The epitaxial process 204 of the present embodiment is well suited to deposit a wide variety of materials having different thicknesses over the cleave plane of the donor wafer 202. Furthermore, it should be understood that the layer of material (e.g., silicon) deposited on donor wafer 202 during the epitaxial process 204 will be the main layer of material (e.g., silicon) eventually transferred from the donor wafer 202 to the handle wafer 210.

Once the epitaxial process 204 of FIG. 2 is completed, the donor wafer 202 enters an oxidation process 206 where a layer of oxide is grown on the material (e.g., silicon) of the donor wafer 202. The oxidation process 206 of the present embodiment is well suited to grow a wide variety of oxides having different thicknesses over the layer of material (e.g., silicon) of the donor wafer 202. For example, the oxide layer of the present embodiment may be grown thinly, e.g., having a thickness of about 100 angstroms (Å) or grown thicker to become the final product's buried oxide. Furthermore, the oxide layer may act as a protective layer (commonly referred to as a screen oxide) where it is later stripped away. However, the oxide layer grown during the oxidation process 206 may also remain as part of the final product. It should be understood that the oxidation process 206 of the present embodiment is well suited to also deposit or spin-on the oxide layer. After the oxidation process 206, the donor wafer 202 enters an implantation process 208 when hydrogen (H) is implanted into the cleave plane through the oxide layer and the layer of material (e.g., silicon). Upon completion of the implantation process 208, the donor wafer 202 is cleaned (not shown) before entering a plasma activation and bonding process 214.

Referring now to the handle wafer 210 (which may also be referred to as a target wafer) of process 200. Specifically, the handle wafer 210 enters an oxidation process 212 where a layer of oxide is grown over the substrate of the handle wafer 210. The oxidation process 212 of the present embodiment is well suited to grow a wide variety of oxides having different thicknesses over the substrate of the handle wafer 210. For example, the oxide layer of the oxidation process 212 may be grown to a thickness of substantially 300 Å, 500 Å, 1000 Å, 2000 Å, 4000 Å, 10000 Å, 15000 Å, or any other thickness. It should be understood that the oxidation process 212 of the present embodiment is well suited to also deposit or spin-on the oxide layer. Upon completion of the oxidation process 212, the handle wafer 210 is cleaned (not shown) before entering the plasma activation and bonding process 214.

Figure 3:
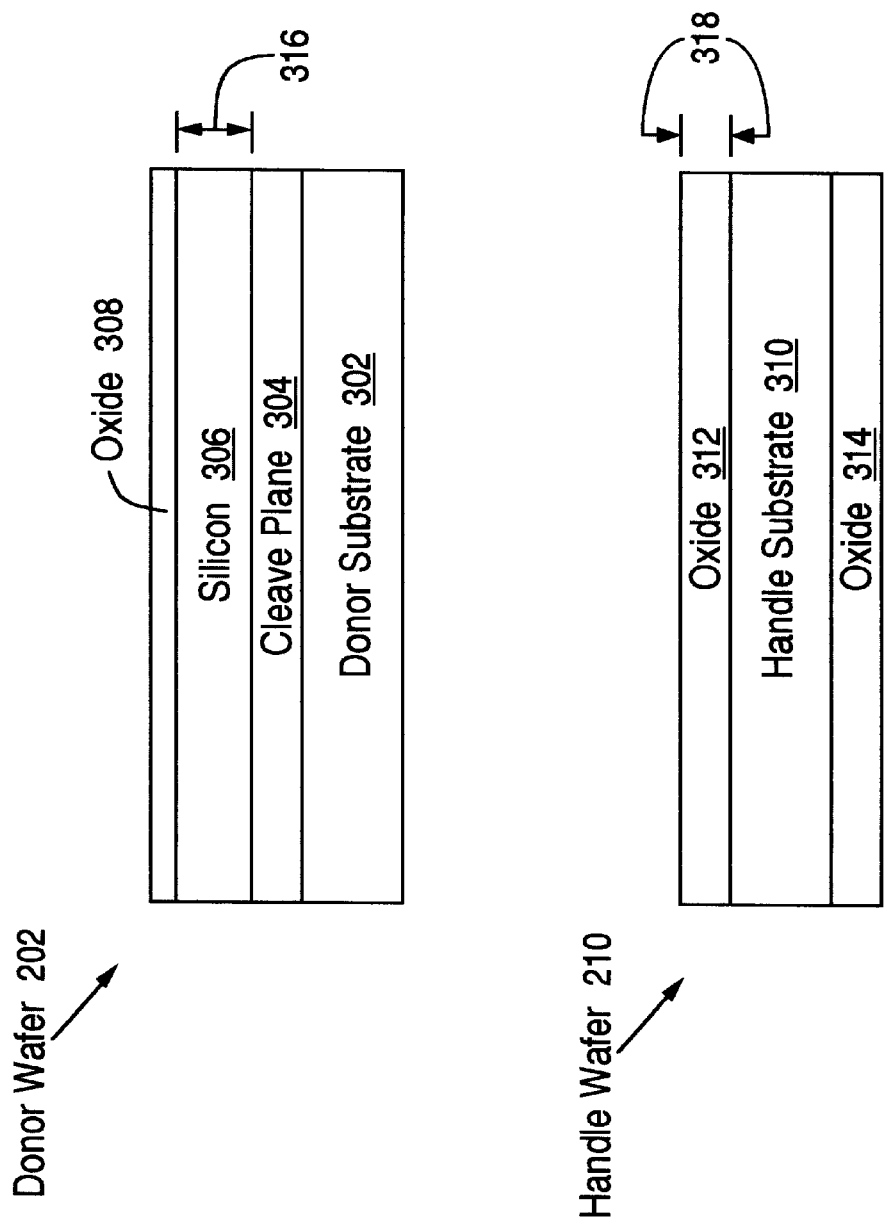
FIG. 3 is a diagram illustrating a exemplary cross sectional view of both a donor wafer and a handle wafer in accordance with an embodiment of the present invention.

FIG. 3 is a diagram illustrating an exemplary cross sectional view of both the donor wafer 202 and the handle wafer 210 as they enter the plasma activation and bonding process 214 of process 200. Specifically, the donor wafer 202 includes a substrate 302 upon which a cleave plane 304 was deposited. Furthermore, the donor wafer 202 has a silicon layer 306 which was grown over the cleave plane 304 during EPI process 204 and has a thickness 316. Finally, a thin oxide layer 308 was grown over the silicon layer 306 during oxidation process 206. As mentioned previously, the thin oxide layer 308 may act as a protective layer (referred to as a screen oxide) where it is later stripped away. However, the oxide layer 308 grown during the oxidation process 206 may also remain as part of the final product. As for the handle wafer 210, it includes a substrate 310 upon which oxide layers 312 and 314 are grown during oxidation process 212 and each layer of oxide layers 312 and 314 is equal to thickness 318.

During the plasma activation and bonding process 214 of FIG. 2, the donor wafer 202 and handle wafer 210 go through a plasma activation process followed by the oxide layer (e.g., 312) of the handle wafer 210 being bonded to the layer of material (e.g., silicon layer 306) of the donor wafer 202, if the oxide layer (e.g., 308) of the donor wafer 202 had been removed. However, if the oxide layer (e.g., 308) of the donor wafer 202 is not removed, the oxide layer (e.g., 308) of the handle wafer 210 is bonded to the oxide layer (e.g., 312) of the donor wafer 202.

The bonded donor wafer 202 and handle wafer 210 of FIG. 2 next enter a bond anneal process 216 that is a thermal step utilized to make the bond stronger and thereby enabling the donor wafer 202 and handle wafer 210 to be subsequently separated. Next, the bonded donor wafer 202 and handle wafer 210 enter a controlled cleaving process 218 that is utilized to separate the donor wafer 202 and the handle wafer 210. Specifically, during the controlled cleaving process 218, a fracture is injected into the cleave plane (e.g., 304) of the donor wafer 202 and then propagated along the cleave plane thereby releasing the donor wafer 202 from the handle wafer 210. For example, the controlled cleaving process 218 may generate a hydrostatic pressure of nitrogen on the edges of the cleave plane (e.g., 304) within an O-ring seal thereby separating the donor wafer 202 from the handle wafer 210. Additionally, as a result of controlled cleaving process 218, the material layer (e.g., silicon 306) of the donor wafer 202 is released from it and remains bonded to the handle wafer 210. The controlled cleaving process 218 is described in U.S. Pat. No. 6,033,974 filed on Aug. 10, 1999, entitled "Method and Device for a Controlled Cleaving Process," by Henley et al., and assigned to the assignee of the present invention and is herein incorporated by reference. After the donor wafer 202 and handle wafer 210 are separated, the spent donor wafer 202 goes to reclaim 220 where it may be utilized again within process 200 while the handle wafer 210 goes to a selected etch process 222.

Figure 4:
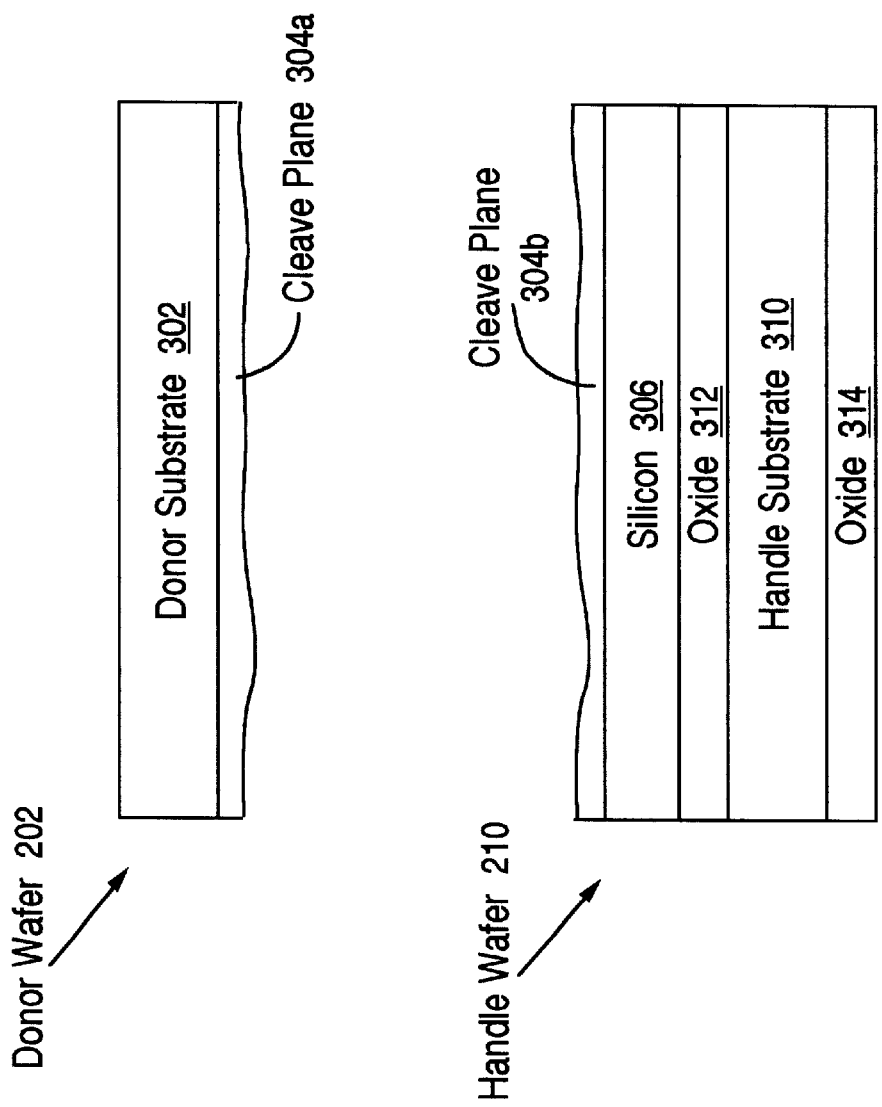
FIG. 4 is a diagram illustrating a exemplary cross sectional view of the donor wafer and handle wafer after they have been cleaved apart in accordance with an embodiment of the present invention.

FIG. 4 is a diagram illustrating an exemplary cross sectional view of the donor wafer 202 and the handle wafer 210 after the controlled cleaving process 218 but before entering the selected etch process 222 of process 200. Specifically, during the controlled cleaving process 218, the cleave plane 304 was separated such that cleave plane 304a is attached to the donor substrate 302 of the donor wafer 202 while cleave plane 304b is attached to the silicon layer 306 of the handle wafer 210. The handle wafer 210 also has the silicon layer 306 bonded to the oxide layer 312 which has presently become a buried oxide layer. It is appreciated that the oxide layer 308 (FIG. 3) of the donor wafer 202 was stripped away before the donor wafer 202 and the handle wafer 210 entered the plasma activation and bonding process 214 of process 200.

During the selected etch process 222 of FIG. 2, the residual cleave plane (e.g., 304b) is removed from the surface of the material layer (e.g., silicon 306) of the handle wafer 210. Next, the handle wafer 210 goes through a cleaning process 224 in preparation for entering an epitaxial process 226 that may involve as many as three different processes. More specifically, during the epitaxial process 226 an epitaxial smoothing process, an epitaxial thickening process, and an annealing process may take place. It should be pointed out that there are advantages associated with performing multiple processes during epitaxial process 226. For example, by combining processes during the epitaxial process 226 the production costs are decreased and the quality of the SOI wafers is improved because there is less handling of the wafers.

During the epitaxial smoothing process of the epitaxial process 226, the handle wafer 210 is put into a gas phase epitaxial (EPI) reactor. Subsequently, the interior of the epitaxial reactor along with the handle wafer 210 are raised to a high temperature (e.g., 1100° C.) and then an etchant (e.g. hydrogen chloride) is flowed into the epitaxial reactor in order to thin the material layer (e.g., silicon 306) of the handle wafer 210. It should be appreciated that the annealing process is part of the epitaxial smoothing process since that process occurs at such a high temperature. Furthermore, as the etchant thins the material layer (e.g., silicon 306) it also smoothes the exposed surface of the material layer (e.g., silicon 306) of the handle wafer 210 down to a roughness of less than 2 angstroms root mean square (RMS). It should be understood that the etchant may be able to smooth the exposed surface of the material layer (e.g. silicon 306) of the handle wafer 210 down to a roughness of about 0.5 to 0.6 angstroms RMS. Moreover, the amount of thinning of the material layer (e.g., 306) achieved during the epitaxial smoothing process may be increased or decreased by altering the duration, flow of the etchant, and temperature of the process. Therefore, the epitaxial smoothing process of the epitaxial process 226 may be utilized to thin the thickness of the material layer (e.g. silicon 306) of the handle wafer 210. It should be appreciated that for silicon-on-insulator wafers of the present embodiment, the thickness of the material layer (e.g. silicon 306) of the handle wafer 210 may fall within the range of substantially equal to or less than 1.5 micrometers and greater than zero.

If it is desirable to have a thicker material layer (e.g. silicon 306) of the handle wafer 210 of FIG. 2, the epitaxial thickening process of the epitaxial process 226 may occur once the material layer (e.g. silicon 306) of the handle wafer 210 has been thinned during the epitaxial smoothing process. It should be pointed out that the epitaxial smoothing process is performed even if it is desirable to thicken the material layer (e.g., silicon 306) of the handle wafer 210. During the epitaxial thickening process of the epitaxial process 226, the handle wafer 210 remains within the gas phase epitaxial reactor, the temperature is adjusted to a particular temperature and then a gas (e.g., trichlorosilane) is flowed into the epitaxial reactor in order to build up the thickness of the material layer (e.g., silicon 306). Additionally, the amount of thickening of the material layer (e.g. silicon 306) of the handle wafer 210 achieved during the epitaxial thickening process may be increased or decreased by altering the duration, flow of the gas (e.g., trichlorosilane), and temperature of the process. As such, the epitaxial thickening process of the epitaxial process 226 may be utilized to thicken the thickness of the material layer (e.g. silicon 306) of the handle wafer 210.

Figure 5:
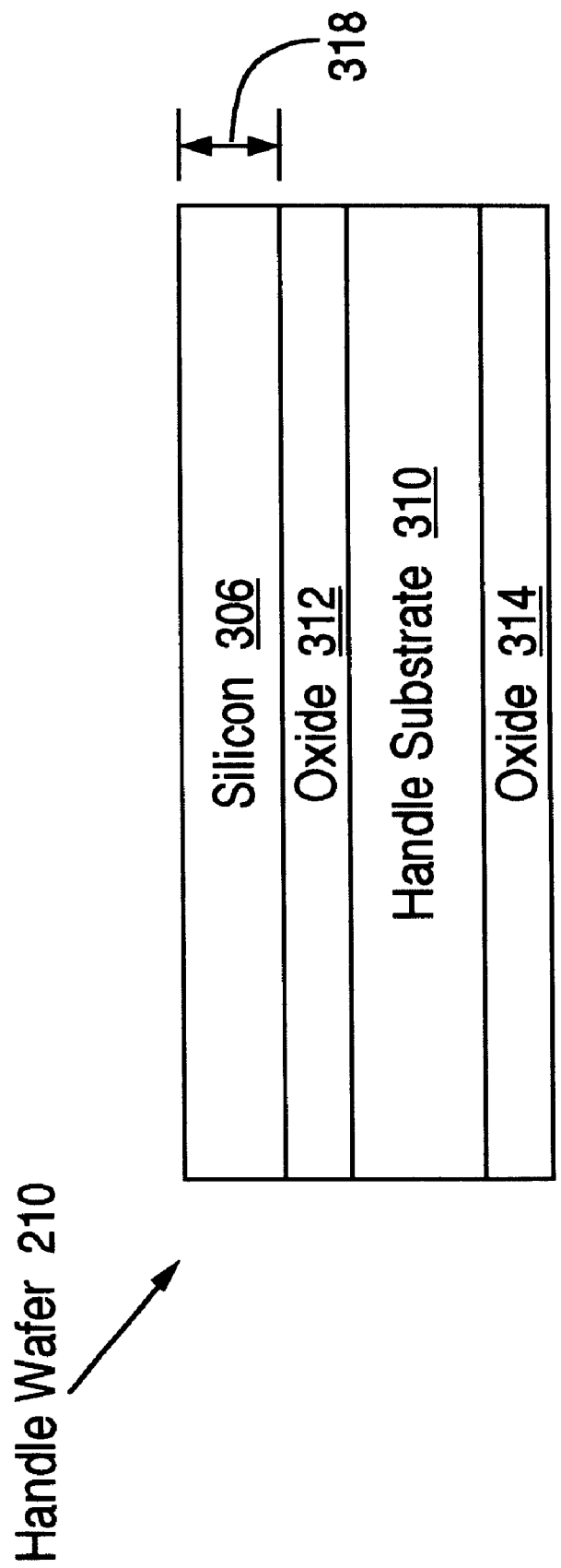
FIG. 5 is a diagram illustrating a exemplary cross sectional view of the handle wafer once the cleave plane has been removed in accordance with an embodiment of the present invention.

FIG. 5 is a diagram illustrating an exemplary cross sectional view of the handle wafer 210 after going through the epitaxial process 226 in accordance with an embodiment of the present invention. Specifically, the thickness 318 of silicon layer 306 may have been increased or decreased during the epitaxial process 226 as described above.

The different processes of the epitaxial process 226 are described in detail in the following patent applications and issued patent which are herein incorporated by reference: U.S. patent application Ser. No. 09/710,628 filed Nov. 8, 2000, entitled "Improved Treatment Method of Film Quality for the Manufacture of Substrates," by Sien G. Kang et al., and assigned to the assignee of the present invention; U.S. patent application Ser. No. 09/364,209 filed Jul. 30, 1999, entitled "A Smoothing Method for Cleaved Films Made Using a Release Layer," by Igor J. Malik et al., and assigned to the assignee of the present invention; U.S. patent application Ser. No. 09/399,985 filed Sep. 20, 1999, entitled "Surface Finishing of SOI Substrates Using an EPI Process," by Sien G. Kang et al., and assigned to the assignee of the present invention; and U.S. Pat. No. 6,204,151 entitled "Smoothing Method for Cleaved Films Made Using Thermal Treatment," by Igor J. Malik et al., and assigned to the assignee of the present invention.

Once the epitaxial process 226 of FIG. 2 is completed, the handle wafer 210 goes through a final cleaning process 228 in preparation for entering an inspection process 230. Subsequently, the handle wafer 210 enters the inspection process 230 where it is determined whether the handle wafer 210 has been properly fabricated by satisfying specific parameters. If the handle wafer 210 does not pass the inspection process 230 for any reason, it may be discarded or utilized for another purpose depending on the reason for its inspection failure. However, if the handle wafer 210 passes the inspection process 230, it may be subsequently utilized by the fabricator or it may be shipped to its final destination.

In an alternative embodiment of process 200, handle wafer 210 does not go through the oxidation process 212 and remains a bare substrate (e.g., 310). As such, the layer of oxide (e.g., 308) grown on the silicon layer (e.g., 306) of the donor wafer 202 during the oxidation process 206 is grown to the desired final product thickness. As such, the oxide layer (e.g., 308) of the donor wafer is subsequently bonded to the handle substrate (e.g., 310) during the plasma activation and bonding process 214. The bonded handle wafer 210 and donor wafer 202 would then continue through the other process steps of process 200, described above. Therefore, the donor wafer 202 may include all or a part of the oxide layer that is transferred to the handle wafer 210.

Some of process 200 is described in detail in the following patent application which is herein incorporated by reference: U.S. patent application Ser. No. 09/370,959 filed Aug. 10, 1999, entitled "A Cleaving Process to Fabricate Multilayered Substrates Using Low Implant Doses," by Henley et al., and assigned to the assignee of the present invention.

Figure 6:
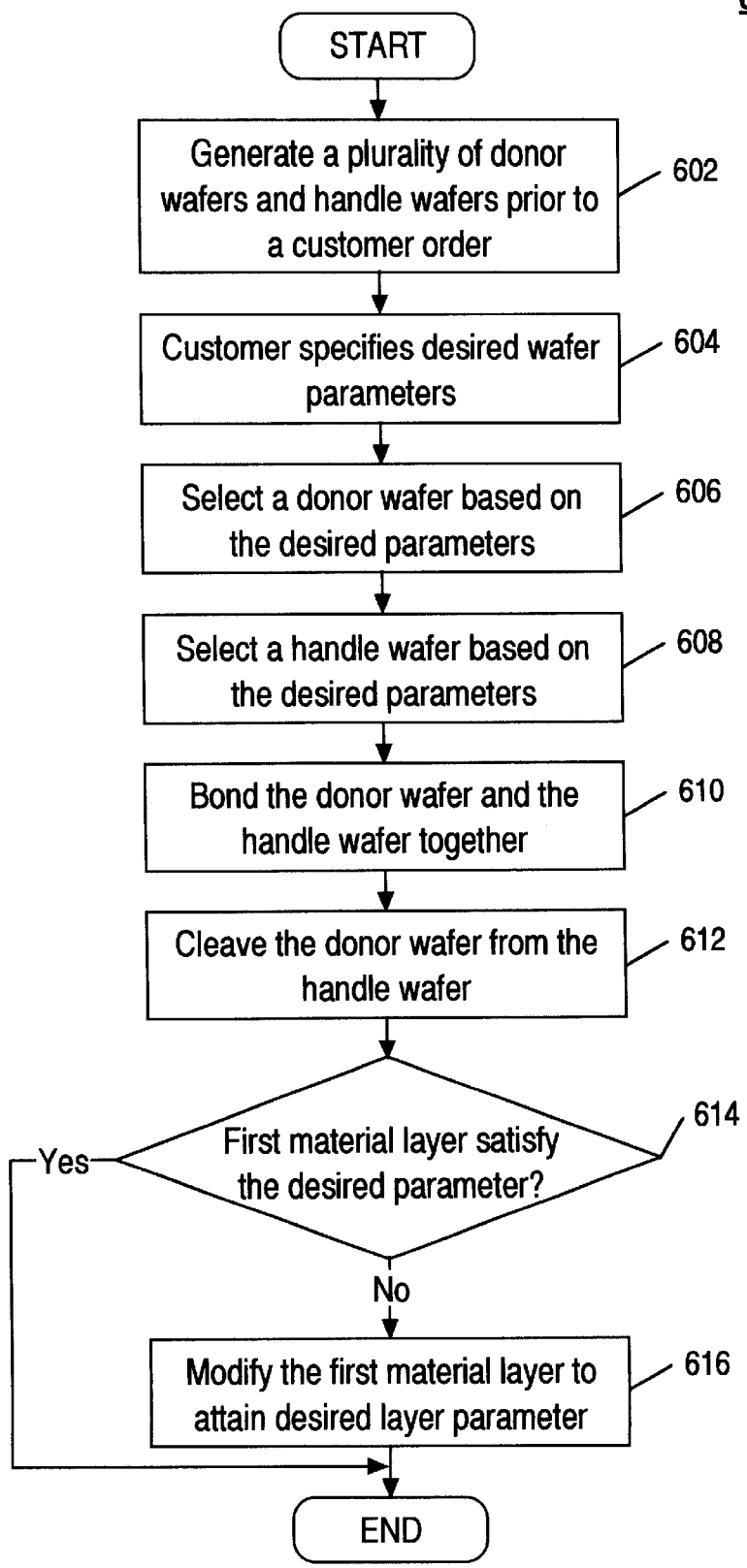
FIG. 6 is a flowchart of steps performed in accordance with one embodiment of the present invention for generating a plurality of donor wafers and handle wafers prior to an order being placed by a customer.

FIG. 6 is a flowchart 600 of steps performed in accordance with one embodiment of the present invention for generating a plurality of donor wafers (e.g., 202) and handle wafers (e.g., 210) prior to an order being placed by a customer. Flowchart 600 includes processes of the present invention which, in one embodiment, are carried out by processors and electrical components under the control of computer readable and computer executable instructions. The computer readable and computer executable instructions reside, for example, in data storage features such as computer usable volatile memory 104 and/or computer usable non-volatile memory 106 of FIG. 1. However, the computer readable and computer executable instructions may reside in any type of computer readable medium. Although specific steps are disclosed in flowchart 600, such steps are exemplary. That is, the present invention is well suited to performing various other steps or variations of the steps recited in FIG. 6. Within the present embodiment, it should be appreciated that the steps of flowchart 600 may be performed by humans or software or hardware or any combination of humans, software, and hardware.

The present embodiment enables the generation of a plurality of donor wafers (e.g., 202) and handle wafers (e.g., 210) prior to an order being placed by a customer. As such, flowchart 600 enables wafers (e.g., silicon-on-insulator wafers) to be fabricated more efficiently thereby reducing the turnaround time of fulfilling an order for a batch of predefined wafers. For example, a plurality of donor wafers having different silicon layer thicknesses are generated along with a plurality of handle wafers having different oxide layer thicknesses. In this manner, a customer may order (for example) a batch of SOI wafers that share the same parameters (e.g., silicon layer thickness, oxide layer thickness, and the like). Subsequently, a donor wafer may be selected from the plurality of donor wafers based on the thickness of its silicon layer while a handle wafer may be selected from the plurality of handle wafers based on the thickness of its oxide layer. The selected donor wafer and handle wafer are then bonded together. A cleaving process is then utilized in order to separate the donor wafer from the handle wafer in such a manner as to enable the handle wafer to retain the silicon layer of the donor wafer. The silicon layer of the handle wafer may be modified in order to alter its thickness depending on its desired thickness. For example, an epitaxial smoothing process may be utilized in order to decrease the thickness of the handle wafer silicon layer while an epitaxial thickening process may be utilized in order to increase its silicon layer thickness.

At step 602 of FIG. 6, the present embodiment generates a plurality of donor wafers (e.g., 202) having different first material layer (e.g., silicon, etc.) thicknesses along with a plurality of handle wafers (e.g., 210) having different second material layer (e.g., oxide, silicon dioxide, etc.) thicknesses prior to a customer order being placed. For example, the generated plurality of donor wafers (e.g., 202) may include donor wafers having first material layer (e.g., silicon) thicknesses of substantially 10000 Å, 300 Å, 500 Å, 750 Å, 1100 Å, 2000 Å, 11000 Å, and 15000 Å. Furthermore, the generated plurality of handle wafers (e.g., 210) of step 602 may include handle wafers having second material layer (e.g., oxide) thicknesses of substantially 300 Å, 500 Å, 1000 Å, 2000 Å, 4000 Å, 10000 Å, 15000 Å. It should be appreciated that a wide variety of wafer combinations may be subsequently fabricated from these few different standard thicknesses of donor wafers (e.g., 202). and handle wafers (e.g., 210). For example, the thicknesses associated with the donor wafers (e.g., 202) and handle wafers (e.g., 210) mentioned above may result in 20 different wafer combinations. It is appreciated that the plurality of donor wafers (e.g., 202) and the plurality of handle wafers (e.g., 210) of step 602 may be generated in a manner similar to that described above with reference to process 200 of FIG. 2.

In step 604, a customer may order (for example) a batch of wafers (e.g., silicon-on-insulator) that share the same parameters (e.g., first material layer thickness, second material layer thickness, and the like). At step 606, the present embodiment selects a donor wafer (e.g., 202) from the plurality of donor wafers based on the customer's parameters (e.g., thickness of its first material layer). For example, the present embodiment may select a donor wafer (e.g., 202) because the first material layer thickness (e.g., 1100 Å) is the closest thickness to the customer's desired thickness (e.g., 1000 Å). In step 608, the present embodiment selects a handle wafer (e.g., 210) from the plurality of handle wafers based on the customer's parameters (e.g., thickness of its second material layer). For example, the present embodiment may select a handle water (e.g., 210) because the second material layer thickness (e.g., 500 Å) satisfies the customer's desired thickness. It is appreciated that steps 606 and 608 of the present embodiment are well suited to be performed in a different order. For example, step 608 of the present embodiment may be performed before step 606 is performed or both steps may be performed simultaneously.

At step 610 of FIG. 6, the present embodiment bonds the selected donor wafer (e.g., 202) and the selected handle wafer (e.g., 210) together. It is appreciated that the selected donor wafer and the selected handle wafer may be bonded together at step 610 in a wide variety of ways in accordance with the present embodiment. For example, the selected donor wafer (e.g., 202) and the selected handle wafer (e.g., 210) may be bonded together at step 610 in a manner similar to that described above with reference to process 200 of FIG. 2. In step 612, the present embodiment performs a cleaving process in order to separate the donor wafer (e.g., 202) and the handle wafer (e.g., 210) in such a manner as to enable the handle wafer to retain the second material layer (e.g., silicon) of the donor wafer. It is understood that the cleaving process of step 612 may be performed in a wide variety of ways in accordance with the present embodiment. For example, the cleaving process of step 612 may be performed in a manner similar to that described above with reference to process 200.

At step 614, the present embodiment determines whether the first material layer (e.g., silicon) of the handle wafer (e.g., 210) satisfies the desired layer parameter (e.g., thickness, smoothness, and the like) specified by the customer. If the present embodiment determines that the first material layer of the handle wafer (e.g., 210) does satisfy the desired layer parameter specified by the customer at step 612, the present embodiment exits flowchart 600. However, if the present embodiment determines that the first material layer of the handle wafer (e.g., 210) does not satisfy the desired layer parameter specified by the customer at step 612, the present embodiment proceeds to step 616. In step 616, the present embodiment modifies the first material layer (e.g., silicon) of the handle wafer (e.g., 210) in order to attain the desired layer parameter specified by the customer. For example, an epitaxial smoothing process may be utilized at step 616 in order to decrease the thickness of the first material layer (e.g., silicon) of the handle wafer (e.g., 210) while an epitaxial thickening process may be utilized in order to increase its first material layer thickness. It is understood that the modifying of the first material layer (e.g., silicon) of the handle wafer (e.g., 210) may be performed in a manner similar to that described above with reference to process 200. Once step 616 is completed, the present embodiment exits flowchart 600.

It is appreciated that there are advantages associated with flowchart 600. For example, one of the advantages of flowchart 600 is that it enables silicon-on-insulator wafers to be fabricated more efficiently thereby reducing the turn-around time of fulfilling a customer's order for a batch of predefined silicon-on-insulator wafers. Specifically, a donor wafer inventory may be generated where there are multiple copies of donor wafers having different silicon layer thicknesses. Furthermore, a handle wafer inventory may be generated where there are multiple copies of handle wafers having different oxide layer thicknesses. As such, standard silicon-on-insulator wafers may be quickly assembled as the need arises. Moreover, in this manner, nonstandard silicon-on-insulator wafers may also be customized more quickly. Therefore, flowchart 600 enables a manufacturer of (for example) silicon-on-insulator wafers to cut manufacturing costs and efficiently shorten the amount of time needed to complete a customer's order for a batch of silicon-on-insulator wafers sharing the same specifications.

Additionally, it should be pointed out that an inventory of the most popular (for example) silicon-on-insulator wafers may be completely generated by a manufacturer prior to an order being placed by a customer. In this manner, once a customer places an order for one of the popular silicon-on-insulator wafers, the manufacturer is able to fulfill the customer's order in a minimal amount of time and with a minimal amount of effort. Furthermore, if requested by a customer, the first material layer (e.g., silicon) of the completely generated silicon-on-insulator handle wafers may also be quickly customized by entering them into the epitaxial process 226 where they may be thinned or thickened as desired.

Accordingly, the present invention provides a method and system which enables silicon-on-insulator (SOI) wafers to be fabricated more efficiently thereby reducing the turn-around time of fulfilling an order for a batch of predefined SOI wafers.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for generating a plurality of donor wafers and handle wafers prior to an order being placed by a customer, said method comprising the steps of:
   receiving a desired layer thickness;
   selecting a donor wafer based upon said desired layer thickness from a plurality of donor wafers having different thickness of a first material layer;
   selecting a handle wafer based upon said desired layer thickness from a plurality of handle wafers having different thickness of a second material layer;
   bonding said donor wafer and said handle wafer together; and
   modifying the thickness of said first material layer to attain said desired layer thickness.

2. The method as described in claim 1 further comprising the step of:
   generating said plurality of donor wafers and said plurality of handle wafers prior to an order being placed by a customer.

3. The method as described in claim 1 wherein said first material layer comprises silicon.

4. The method as described in claim 1 wherein said second material layer comprises silicon dioxide.

5. The method as described in claim 1 wherein said donor wafer and said handle wafer are utilized to create a silicon-on-insulator (SOI) wafer.

6. The method as described in claim 5 wherein said thickness of said first material layer falls within the range of substantially equal to or less than 1.5 micrometers and greater than zero.

7. The method as described in claim 1 wherein said first material layer has an exposed surface having a roughness of less than 2 angstroms root mean square (RMS).

8. The method as described in claim 1 wherein said step of modifying said thickness of said first material layer to attain said desired layer thickness comprises the step of performing an epitaxial (EPI) smoothing process.

9. The method as described in claim 1 wherein said step of modifying said thickness of said first material layer to attain said desired layer thickness comprises the step of performing an epitaxial (EPI) thickening process.

10. The method as described in claim 1 wherein said step of modifying said thickness of said first material layer to attain said desired layer thickness comprises the step of performing an epitaxial (EPI) smoothing process, an epitaxial (EPI) thickening process, and annealing process.

11. A computer readable medium having computer readable code embodied therein for causing a system to perform the steps of:
   receiving a desired layer thickness;
   selecting a donor wafer based upon said desired layer thickness from a plurality of donor wafers having different thickness of a first material layer;
   selecting a handle wafer based upon said desired layer thickness from a plurality of handle wafers having different thickness of a second material layer;

bonding said donor wafer and said handle wafer together; and modifying the thickness of said first material layer to attain said desired layer thickness.

12. The computer readable medium as described in claim 11 further comprising the step of:

generating said plurality of donor wafers and said plurality of handle wafers prior to an order being placed by a customer.

13. The computer readable medium as described in claim 11 wherein said first material layer comprises silicon.

14. The computer readable medium as described in claim 11 wherein said second material layer comprises silicon dioxide.

15. The computer readable medium as described in claim 11 wherein said donor wafer and said handle wafer are utilized to create a silicon-on-insulator (SOI) wafer.

16. The computer readable medium as described in claim 15 wherein said first material layer thickness falls within the range of substantially equal to or less than 1.5 micrometers and greater than zero.

17. The computer readable medium as described in claim 11 wherein said first material layer has an exposed surface having a roughness of less than 2 angstroms root mean square (RMS).

18. The computer readable medium as described in claim 11 wherein said step of modifying said thickness of said first material layer to attain said desired layer thickness comprises the step of performing an epitaxial (EPI) smoothing process.

19. The computer readable medium as described in claim 11 wherein said step of modifying said thickness of said first material layer to attain said desired layer thickness comprises the step of performing an epitaxial (EPI) thickening process.

20. The computer readable medium as described in claim 11 wherein said step of modifying said thickness of said first material layer to attain said desired layer thickness comprises the step of performing an epitaxial (EPI) smoothing process, an epitaxial (EPI) thickening process, and annealing process.

21. A method for generating a plurality of donor wafers and handle wafers prior to an order being placed by a customer, said method comprising the steps of:

generating a plurality of donor wafers and a plurality of handle wafers prior to an order being placed by said customer;

receiving a desired layer thickness;

selecting a donor wafer based upon said desired layer thickness from a plurality of donor wafers having different thickness of a material layer;

selecting a handle wafer based upon said desired layer thickness from a plurality of handle wafers having different thickness of an oxide layer;

bonding said donor wafer and said handle wafer together; and modifying the thickness of said material layer to attain said desired layer thickness.

22. The method as described in claim 21 wherein said material layer comprises silicon.

23. The method as described in claim 21 wherein said oxide layer comprises silicon dioxide.

24. The method as described in claim 21 wherein said donor wafer and said handle wafer are utilized to create a silicon-on-insulator (SOI) wafer.

25. The method as described in claim 24 wherein said thickness of said material layer falls within the range of substantially equal to or less than 1.5 micrometers and greater than zero.

26. The method as described in claim 21 wherein said material layer has an exposed surface having a roughness of less than 2 angstroms root mean square (RMS).

27. The method as described in claim 21 wherein said step of modifying said thickness of said material layer to attain said desired layer thickness comprises the step of performing an epitaxial (EPI) smoothing process.

28. The method as described in claim 21 wherein said step of modifying said thickness of said material layer to attain said desired layer thickness comprises the step of performing an epitaxial (EPI) thickening process.

29. The method as described in claim 21 wherein said step of modifying said thickness of said material layer to attain said desired layer thickness comprises the step of performing an epitaxial (EPI) smoothing process, an epitaxial (EPI) thickening process, and annealing process.

* * * * *